(12) United States Patent
Nygren

(10) Patent No.: US 6,385,102 B2
(45) Date of Patent: May 7, 2002

(54) REDUNDANCY MULTIPLEXER FOR A SEMICONDUCTOR MEMORY CONFIGURATION

(75) Inventor: Aaron Nygren, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/793,343

(22) Filed: Feb. 26, 2001

(30) Foreign Application Priority Data

Feb. 24, 2000 (DE) .......................................... 100 08 578

(51) Int. Cl.$^7$ ................................................ G11C 7/00
(52) U.S. Cl. ................................... 365/200; 365/230.02
(58) Field of Search ........................... 365/200, 230.06, 365/191, 189.02, 230.02, 210

(56) References Cited

U.S. PATENT DOCUMENTS

| | | | | |
|---|---|---|---|---|
| 3,882,470 A | * | 5/1975 | Hunter | 340/173 |
| 3,900,837 A | * | 8/1975 | Hunter | 340/173 |
| 6,115,301 A | | 9/2000 | Namekawa | |

FOREIGN PATENT DOCUMENTS

JP        11-250 688 A      9/1999

* cited by examiner

Primary Examiner—David Nelms
Assistant Examiner—Thong Le
(74) Attorney, Agent, or Firm—Laurence A. Greenberg; Werner H. Stemer; Ralph E. Locher

(57) ABSTRACT

In the redundancy multiplexer for a semiconductor memory configuration control or switching signals are passed to multiplexer areas only via ¼ of the interface width. This reduces the propagation time for the signals by a factor of 3.

2 Claims, 2 Drawing Sheets

REDUNDANCY MULTIPLEXER FOR A SEMICONDUCTOR MEMORY CONFIGURATION

BACKGROUND OF THE INVENTION

Field of the Invention

The invention lies in the semiconductor and semiconductor memory fields. More specifically, the present invention relates to a redundancy multiplexer for a semiconductor memory configuration for replacing a faulty bit line with a redundant bit line. A control signal is generated in a decoder from information, stored in fuses, about which bit line is to be replaced, and in which two redundancy areas containing the redundant bit line can be selected by the control signal on both sides of a central bus.

FIG. 3 of the drawings shows the design of a conventional redundancy multiplexer for a semiconductor memory configuration. On both sides of a central bus or central area 1, there is an input/output unit (I/O) 2 into which information about which bit line is faulty and needs to be replaced with a redundant bit line is input. In this context, it is naturally possible to replace as many bit lines with redundant bit lines as there are redundant bit lines in total. This information about faulty bit lines is stored in fuses (FUSES) 3. This means that these fuses contain coded fuse information CFI which indicates which bit lines are faulty and need to be replaced with redundant bit lines. We assume here that this coded fuse information CFI on each side of the central bus 1 is output directly, or via control units 6, 7 used during reading or writing, to a redundancy multiplexer (RMUX) 8, 9 via an appropriate fuse bus 4 (indicated schematically by a dotted line) via a buffer and decoder 5 which supplies decoded fuse information FI. By way of example, the fuses 3 situated on the right of the central bus 1 in FIG. 3 thus transmit the coded fuse information CFI via the buffer and decoder 5, which produces the decoded fuse information FI therefrom, to the control unit 6, and the latter distributes it over the entire interface width of the redundancy multiplexer 9 using sense amplifiers (SSA) 10 before the associated redundant bit line in an area 11 next to the memory cell array 13 is driven.

Such a procedure for selecting redundant bit lines presents no problems as long as the interface width between the redundancy multiplexers 8, 9 and the sense amplifiers 10 and/or the memory cell array 13 is relatively narrow. With increasing interface width, such as in the case of a 128 bit eDRAM, the relatively large interface width builds up time delays, which present a serious problem: as shown schematically in FIG. 3, the control signals for driving each redundant bit line have to pass through the entire width of the interface, which means that the fuse information CFI or FI has to propagate over a maximum of ¾ of the interface width. By way of example, the fuse information CFI or FI needs to pass from the fuse area 3 situated on the left of the central bus 1 in FIG. 3 (cf. dotted line 4) to the control unit 7 and then propagate from there to the right-hand or left-hand edge of the redundancy multiplexer 9, until the sense amplifier 10 associated with the redundant bit line in area 11 has been found.

This time delay is ultimately caused by the redundant bit lines in area 11 for the redundancy multiplexer 9 and in area 12 for the redundancy multiplexer 8 being driven via the entire width of the interface on both sides of the central bus 1.

In order to maintain a maximum number of repair opportunities for faulty bit lines using redundant bit lines, the normal arrangement inevitably involves long delay times caused by the control signals propagating over ¾ of the interface width.

FIG. 4 illustrates the details of the layout of the existing redundancy multiplexer 8 or 9 of FIG. 3: starting from a decoder 5 which is arranged on both sides of the central bus 1 and receives information from five fuses 3 (four fuses for address information "Coded Fused address" and one fuse for "Fused Enable"), 16 switch signals are respectively supplied on both sides of the central bus 1 in order to drive 16 switches 14 in the redundancy multiplexer 8 (for the decoder 5 on the right in FIG. 4) and 16 switches 14 in the redundancy multiplexer 9 (for the decoder 5 on the left in FIG. 4).

On the basis of these switch signals, the data input into the switches 14 ("Data in") are passed on by the switches 14 in the redundancy multiplexers 8, 9 ("Data out"), in order thus to drive any redundant bit lines, for example in the area of the central bus 1, as indicated schematically in FIG. 4 by "RED".

This prior art layout may be termed unilateral, since no distinction is drawn between the two sides of the central bus 1 for the redundancy multiplexers 8, 9, and the redundancy multiplexers 8, 9 are "unilateral" for the central bus 1 and hence also for the entire interface width.

SUMMARY OF THE INVENTION

The object of the present invention is to provide a redundancy multiplexer for a semiconductor memory which overcomes the above-noted deficiencies and disadvantages of the prior art devices and methods of this general kind, and which prevents the delay times caused by the unilateral structure when the switching signals are propagated and is thus distinguished by shortened propagation times for these switching signals.

With the above and other objects in view there is provided, in accordance with the invention, a redundancy multiplexer for a semiconductor memory configuration for replacing a faulty bit line with a redundant bit line, which comprises:

a decoder having an input receiving information, stored in fuses, concerning a bit line to be replaced, and generating therefrom a control signal;

a first redundancy area containing first redundant bit lines in a first area on a first side of a central bus;

a second redundancy area containing second redundant bit lines in a second area on a second side of the central bus opposite the first side;

the first and second redundancy areas being selectable by the control signal;

the decoder transmitting the control signals to the first and second redundancy areas bilaterally, such that the control signals each propagate only on one side of the central bus, and that the parts of the first and second redundancy areas situated on the first or second side of the central bus receive, via the control signals, only the decoded fuse information for redundant bit lines in the first or second area, and such that a propagation time of the control signal depends on a signal path via half of the part of the first or second redundancy area situated on the one side of the central bus defining one quarter of an interface width of the redundancy multiplexer.

The invention achieves this object for a redundancy multiplexer of the type mentioned initially by virtue of the fact that, in each case, the decoder supplies the switching or control signal only to zones of the two redundancy areas which are situated on one side of the central bus.

In accordance with an added feature of the invention, each part of the first and second redundancy areas is configured to be utilized for connecting at least one redundant bit line for each faulty bit line.

The redundancy multiplexer according to the invention thus provides a bilateral design. The fuse information decoded in the decoder is evaluated only in control or switching signals on one side of the central bus, which makes it possible to reduce the distance over which these signals have to be propagated to ¼ of the interface width. In other words, the signal propagation time is reduced by a factor of 3. This means that fuse information for the decoder and the switching or control signals supplied by the decoder remain on one or other side of the central bus. However, since in all the information input into the input/output unit is coded in the fuses and this information is decoded in the buffer and decoder, a faulty bit line in one half of the arrangement, that is to say on one side of the central bus, can be replaced with a redundant bit line on the other side of this central bus, so that all "repair opportunities" are kept open. In other words, the functional scope of this "bilaterally" oriented design is equivalent to that of the unilateral design, but has the advantage of a shorter delay time for the control or switching signals, since only a distance of ¼ instead of ¾ of the interface width has to be surmounted.

In a practical example, the interface width can be approximately 3 mm. In the case of the unilateral design, the switching or control signals then need to propagate over a distance of 2.25 mm, whereas the bilateral design in accordance with the present invention now requires only a distance of approximately 0.75 mm for propagation of the signals.

These shorter lines or signal paths reduce the capacitance, which, in addition to reduced propagation times, also allows the use of smaller drive elements or drivers.

Other features which are considered as characteristic for the invention are set forth in the appended claims.

Although the invention is illustrated and described herein as embodied in a redundancy multiplexer for semiconductor memory configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 2:
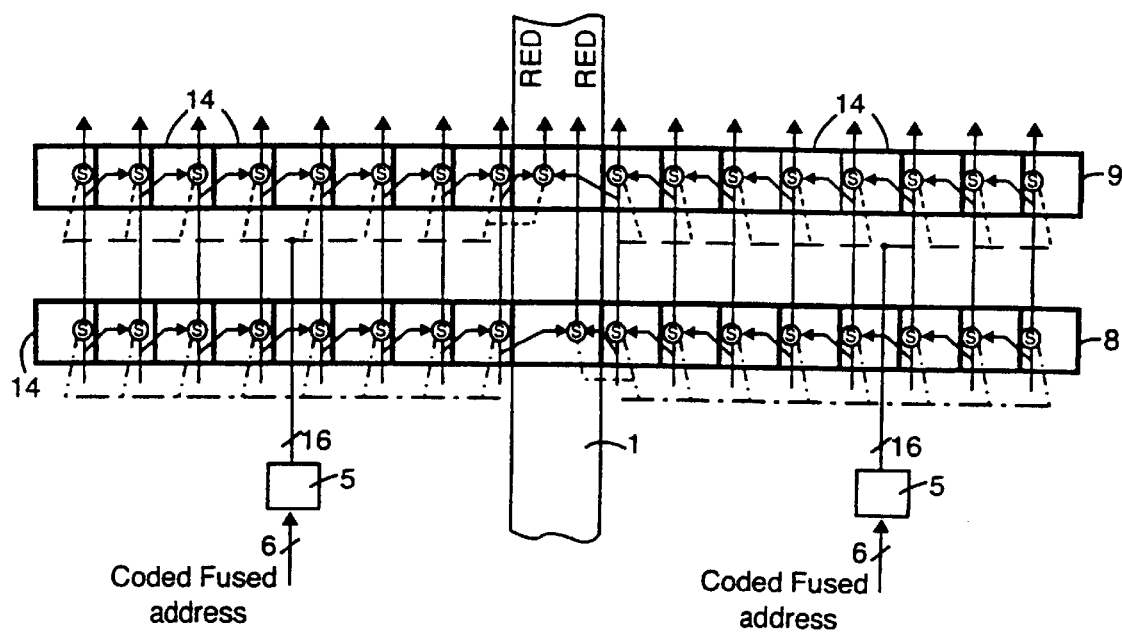
FIG. 2 is a detailed schematic view of the redundancy multiplexer of FIG. 1.
Figure 3:
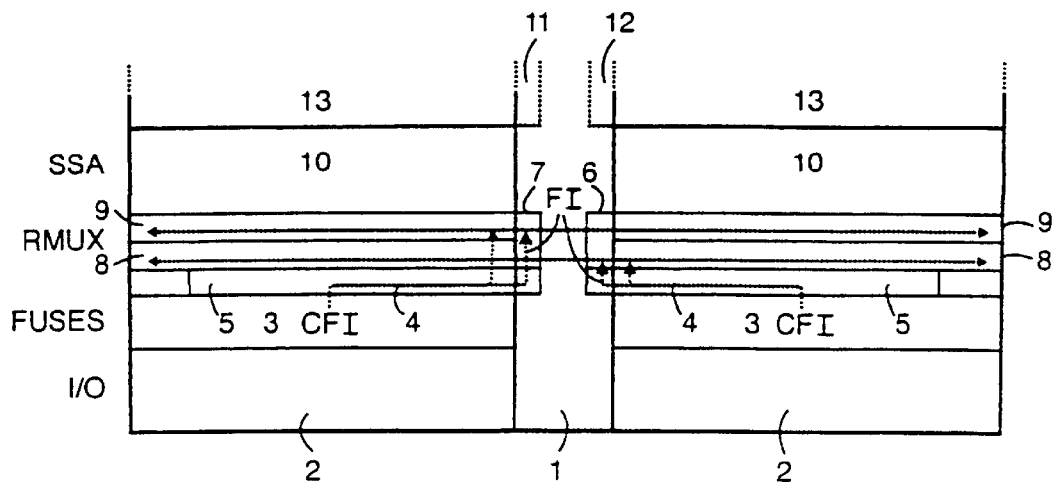
FIG. 3 is a diagram of a prior art redundancy multiplexer for a semiconductor memory configuration.
Figure 4:
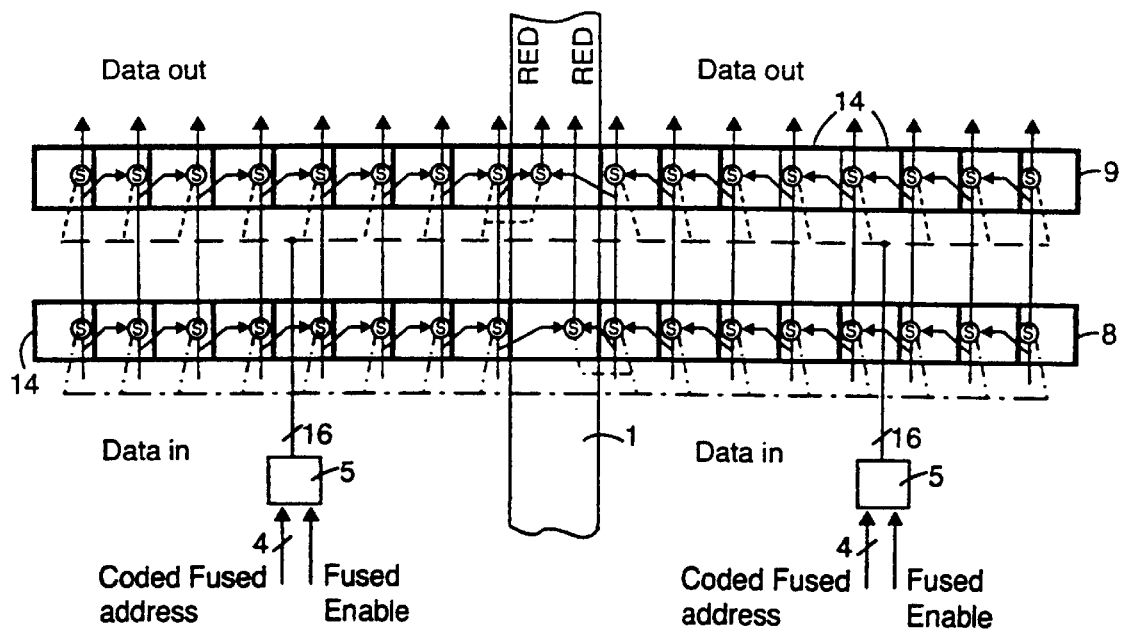
FIG. 4 is a detailed schematic view of the redundancy multiplexer of FIG. 3.

Reference is had to the description of FIGS. 3 and 4 in the introductory text above. Corresponding and functionally equivalent components are identified in FIGS. 1 and 2 with the same reference symbols as in FIGS. 3 and 4, and will therefore not be explained in more detail.

Figure 1:
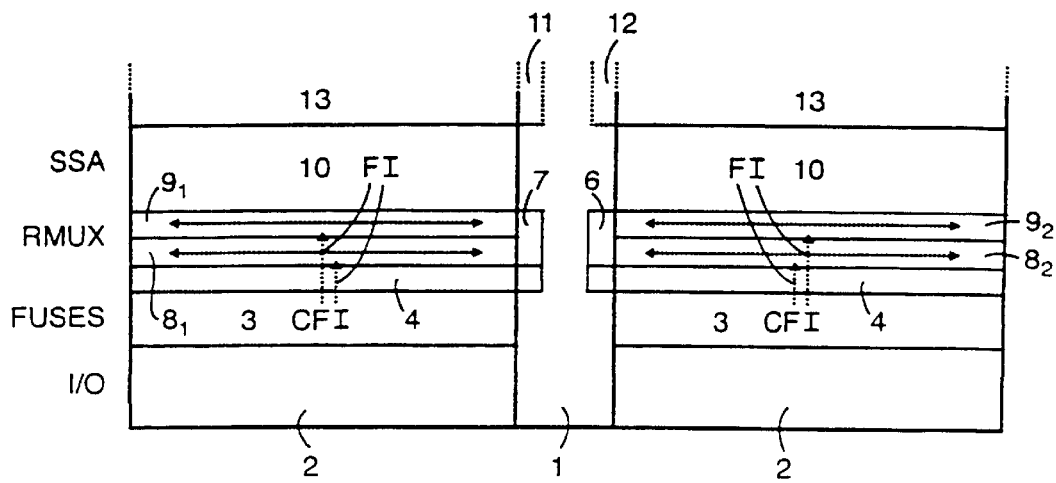
FIG. 1 is a block diagram illustrating the redundancy multiplexer for a semiconductor memory configuration according to the invention.

Referring now to the figures illustrating redundancy multiplexer according to the invention in detail and first, particularly, to FIG. 1 thereof, there is seen an exemplary embodiment of the multiplexer, which differs from the existing redundancy multiplexer shown in FIG. 3 in one fundamental point: the coded fuse information CFI supplied by the fuses 3 via the buffer and decoder 5 is transmitted "bilaterally" to the redundancy multiplexers 8 and 9 such that the switching or control signals (here referred to only as "control signals") are now propagated only on one side of the control bus 1 in each case: the redundancy multiplexer $9_1$ receives the fuse information FI from the decoder 5 for redundancy bit lines in area 11, while the redundancy multiplexer $8_1$ receives the fuse information FI from the decoder 5 for redundancy bit lines in area 12. Similarly, the redundancy multiplexer $9_2$ receives the fuse information FI from the decoder 5 for redundancy bit lines in area 11, while the redundancy multiplexer $8_2$ is supplied with fuse information FI from the decoder 5 for redundancy bit lines in area 12.

In this way, the propagation distance over which the switching or control signals have to propagate is reduced to ¼ of the interface width, as can be seen immediately from the schematic circuit diagram in FIG. 1. This means that the propagation time for the switching or control signals can be reduced by a factor of 3.

FIG. 2 also shows, in a manner similar to FIG. 4, the association between the decoders 5 and individual switches 14 in the multiplexers 8 ($8_1$ and $8_2$) and 9 ($9_1$, $9_2$). In this case, by contrast with the 16 combinations of the configuration in FIG. 4, a total of 36 combinations are possible, since each decoder 5 supplies switches 14 in both multiplexers 8 and 9. In this case, therefore, the decoder 5 is supplied with 6 respective address signals ("Coded Fused address"), as indicated in FIG. 2. An "Enable" signal can be dispensed with in this case.

Whereas, with the existing arrangement shown in FIG. 4, each decoder 5 can use one respective redundancy multiplexer 8 or 9 to connect a redundancy bit line for repairing a faulty bit line, the redundancy multiplexer according to the invention, as illustrated in FIGS. 1 and 2, allows each multiplexer $8_1$, $8_2$ and $9_1$, $9_2$ to connect a respective redundancy bit line, which means that, in this case, each decoder 5 is able to repair two faulty bit lines.

I claim:

1. A redundancy multiplexer for a semiconductor memory configuration for replacing a faulty bit line with a redundant bit line, which comprises:

a decoder having an input receiving information, stored in fuses, concerning a bit line to be replaced, and generating therefrom a control signal;

a first redundancy area containing first redundant bit lines in a first area on a first side of a central bus;

a second redundancy area containing second redundant bit lines in a second area on a second side of the central bus opposite said first side;

said first and second redundancy areas being selectable by the control signal;

said decoder transmitting the control signals to said first and second redundancy areas bilaterally, such that the control signals each propagate only on one side of said central bus, and that the parts of said first and second redundancy areas situated on said first or second side of said central bus receive, via the control signals, only the decoded fuse information for redundant bit lines in said first or second area, and such that a propagation time of the control signal depends on a signal path via half of the part of said first or second redundancy area situated on the one side of said central bus defining one quarter of an interface width of the redundancy multiplexer.

2. The redundancy multiplexer according to claim 1, wherein each part of said first and second redundancy areas is configured to be utilized for connecting at least one redundant bit line for each faulty bit line.

* * * * *